(12) United States Patent
Clube et al.

(10) Patent No.: US 6,329,104 B1
(45) Date of Patent: Dec. 11, 2001

(54) POSITION ALIGNMENT SYSTEM FOR HOLOGRAPHIC LITHOGRAPHY PROCESS

(75) Inventors: Francis Stace Murray Clube, Neuchetel (CH); Basil Arthur Omar, Swindon (GB)

(73) Assignee: Holtronic Technologies, Ltd., Marin (CH)

(*) Notice: Subject to any disclaimer, the term of this patent is extended or adjusted under 35 U.S.C. 154(b) by 0 days.

(21) Appl. No.: 09/260,701

(22) Filed: Mar. 2, 1999

Related U.S. Application Data

(60) Division of application No. 08/784,364, filed on Jan. 17, 1997, now abandoned, which is a continuation-in-part of application No. 08/233,379, filed on Apr. 26, 1994, now abandoned, which is a continuation-in-part of application No. 07/852,024, filed on Mar. 16, 1992, now abandoned.

(51) Int. Cl.[7] ............... G03H 1/00; G03F 7/20
(52) U.S. Cl. ............... 430/1; 430/2; 430/22; 430/30; 359/12; 359/9; 356/400; 356/401
(58) Field of Search .............. 430/1, 2, 22, 30; 356/400, 401; 359/9, 12, 35

(56) References Cited

U.S. PATENT DOCUMENTS

| | | | |
|---|---|---|---|
| 4,200,395 | * 4/1980 | Smith et al. | 356/400 |
| 4,741,622 | * 5/1988 | Suwa et al. | 356/401 |
| 4,777,116 | * 10/1988 | Kawatsuki et al. | 430/290 |
| 4,815,854 | * 3/1989 | Tanaka et al. | 356/401 |
| 4,857,425 | * 8/1989 | Phillips | 430/1 |
| 4,889,780 | * 12/1989 | Cosner | 430/1 |
| 4,966,428 | * 10/1990 | Phillips | 359/9 |
| 5,160,848 | 11/1992 | Saitch et al. | |
| 5,187,372 | * 2/1993 | Clube | 356/401 |
| 5,322,747 | 6/1994 | Hugle. | |

FOREIGN PATENT DOCUMENTS 02-132304 * 5/1990 (JP).
WO 09/13062 * 11/1990 (WO).

OTHER PUBLICATIONS

Kodake et al., "Fabrication of efficient phase gratings...", Optical and Quantum Electron., vol. 14(1), pp. 85–88, Jan. 1982.*

Clube et al., "Holographic MasK Aligner", Optical/Laser Microlithography V., SPIE vol. 1674, pp. 783–792, Mar. 11–13, 1992.*

* cited by examiner

*Primary Examiner*—Martin Angebranndt
(74) *Attorney, Agent, or Firm*—Brian B. Shaw, Esq.; Stephen B. Salai, Esq.; Harter, Secrest & Emery LLP

(57) ABSTRACT

Lithography processes that use multiple layers require registration between layers. The accuracy requirement depends on the application of the lithograph. For microlithography, the registration requirement could be less than one micron. Systems that use lenses for imaging such as optical steppers can image conventional alignment marks through those lenses. A unique microlithography system that employs holograms has properties that are not compatible with known alignment techniques. The present invention is a new system for alignment of holographic microlithography elements.

10 Claims, 2 Drawing Sheets

POSITION ALIGNMENT SYSTEM FOR HOLOGRAPHIC LITHOGRAPHY PROCESS

The present application is a divisional of U.S. Ser. No. 08/784,364, filed Jan. 17, 1997, now abandoned, which is a continuation-in-part of U.S. Ser. No. 08/233,379, filed Apr. 26, 1994 now abandoned, which was a continuation in part of U.S. Ser. No. 07/852,024, filed Mar. 16, 1992, now abandoned.

FIELD OF THE INVENTION

Lithography methods sometimes require that multiple layers be overlaid onto each other. In order for the information of a first layer to be correctly positioned with respect to information on a second or subsequent layer, registration or "alignment" techniques are required.

A unique and patented (U.S. Pat. No. 4,857,425), holographic micro lithography system presents many problems for old alignment techniques. The current invention is a new method of alignment that is compatible with holographic micro lithography systems.

BACKGROUND

Some printed matter such as newsprint or product labels can be printed in a single layer. An example, newsprint, is usually printed in one layer of a single ink (black). In more advanced systems, some information must be printed on top, overlaid, onto a previously printed layer. Color photographs are printed in four layers, each with a different color ink. Each layer must be accurately overlaid in position onto the previous layer for the image to appear correct. Each layer has reference marks outside the area of information, (i.e. photo). The reference marks can be crosshairs, bullseyes, etc. The marks on the printing mask are aligned to some reference on the printing machine. The next layer, with identically located marks can be aligned to the same reference on the machine and information of the two layers will be correctly registered, or aligned. For a system like color photograph printing, alignment of crosshairs by an unaided eye is sufficient for proper registration. The accuracy required depends on how the information printed will be used. For color photographs, it is intended to be viewed by an unaided human eye at a comfortable reading distance. It is a simple test to find that the registration accuracy is not very precise in such lithographic systems. Anyone who has used a magnifying glass to view such printed photos will recall seeing the colored dots that comprise the photo simply near each other but not aligned in an orderly array.

Lithographic systems for other applications sometimes demand far greater accuracy. An example is electronic circuit boards. The signal traces or electronic transmission paths can be very small. A device that uses multilayer paths will require that the paths of the second level be printed onto the paths of the first level such that the paths are positioned accurately with respect to each other. The width of the transmission path usually dictates the accuracy that the layers must be placed. For electronic applications it is common that the overlay accuracy be one fifth of the signal path width. Very advanced systems that are used to print microelectronics circuits require extremely small tolerances. A modern microelectronics circuit could have electronic paths as narrow as five microns, therefore requiring an overlay of one micron.

Currently holographic lithography systems use blind positioning methods for alignment. Wafer handling machinery can replace a wafer to a position with an accuracy that is a fraction of a millimeter without measurement and feedback means. Blind positioning can only be used for systems that can tolerate very coarse alignment.

SUMMARY OF THE INVENTION

The invention is an apparatus for and method of aligning a hologram with respect to a wafer to be printed. An object of the present invention is to provide an alignment method and alignment apparatus for a holographic lithography system that provides registration accuracies compatible with micron and sub-micron micro lithography. According to the first aspect, a method of position alignment of a hologram with respect to a substrate to be printed which comprises the steps: a) making alignment marks on the substrate to be printed, and making alignment marks on the hologram, either on the hologram substrate or in the hologram recording material layer; b) imaging the alignment marks through an optical path; c) comparing the alignment marks on the hologram with alignment marks on the substrate to be printed; d) adjusting the position of either the substrate to be printed or the hologram is provided.

According to a second aspect of the invention, a method of position alignment of a hologram with respect to a substrate to be printed which comprises the steps: a) making alignment marks on the substrate to be printed, and making alignment marks on the hologram, either on the hologram substrate or in the hologram recording material layer; b) prealigning the hologram with respect to the substrate to be printed; c) illuminating the alignment marks; d) detecting a reflected optical beam passed though an optical path, the path of which is through a prism; e) processing image information from the detected beam using a computer; f) generating an error signal dependent upon to the displacement of the marks with respect to each other; g) moving the wafer with respect to the hologram in accordance with the generated error signal; h) optionally repeating steps c) and d), and also e to g) if the alignment is not sufficient; and i) initiating the lithography process; is provided.

The alignment takes place between a hologram that contains the information of the image to be printed in the lithograph; and a substrate that is to be printed on.

According to a third aspect of the invention, a method of aligning a TIR hologram with respect to a substrate to be printed from the TIR hologram, the TIR hologram having a complex high frequency modulation of refractive index formed by holographically recording a pattern into a holographic recording layer, the method comprising the steps: (a) providing alignment marks on the substrate to be printed; (b) providing alignment marks in the holographic recording layer by including alignment marks in a mask and illuminating the alignment marks in the mask so that the light transmitted by the alignment marks in the mask is non-holographically recorded in the holographic recording layer; (c) illuminating the alignment marks in the holographic recording layer and on the substrate to be printed and imaging the light reflected from the alignment marks through an optical system onto a detector; (d) comparing the positions of the alignment marks in the holographic recording layer with the positions of the alignment marks on the substrate to be printed; and (e) adjusting the relative position of either the substrate to be printed or the TIR hologram in response to the comparison of positions.

According to a fourth aspect of the invention, a method of aligning a second-level pattern recorded in a TIR hologram with respect to a first-level pattern printed on a substrate, comprising: (a) providing a mask bearing the second-level pattern and alignment marks; (b) non-holographically recording the alignment marks in the mask into the holographic recording layer by illuminating the alignment marks in the mask; (c) recording a TIR hologram of the second-level pattern by illuminating the second-level pattern in the mask with an object beam and illuminating the holographic recording layer with a reference pattern; (d) providing a substrate bearing reference alignment marks and the first-level pattern; (e) illuminating the alignment marks in the holographic recording layer and the reference alignment marks on the substrate with an illumination beam and imaging the light reflected from the marks through an optical system onto a detector; (f) comparing the positions of the alignment marks in the holographic recording layer with the positions of the reference alignment marks on the substrate; and (g) adjusting the relative position of either the substrate or the TIR hologram in response to the comparison of positions.

DESCRIPTION OF THE PREFERRED EMBODIMENT

Figure 1:
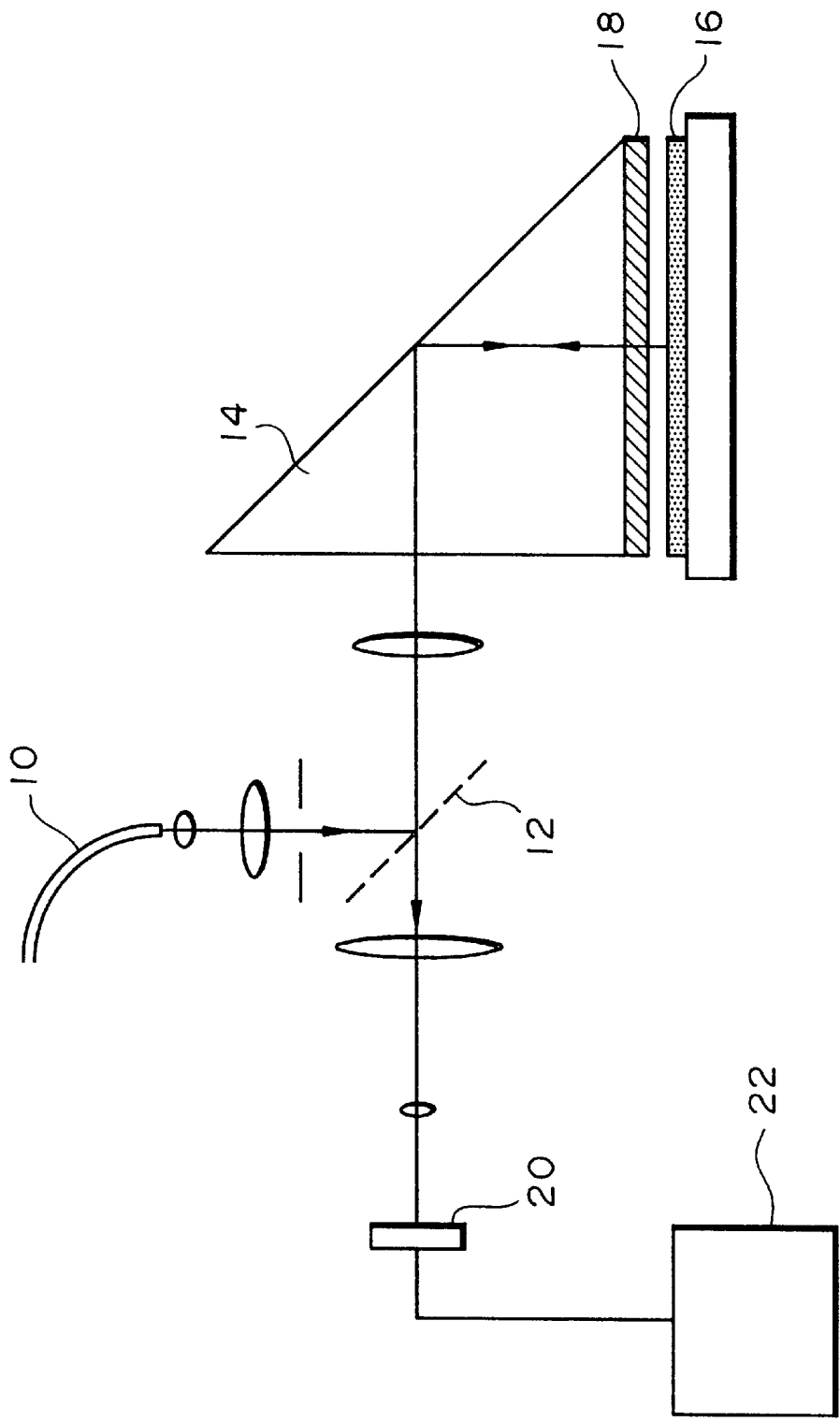
FIG. 1 shows an optical schematic of an optic alignment system in accordance with the invention.
Figure 2A:
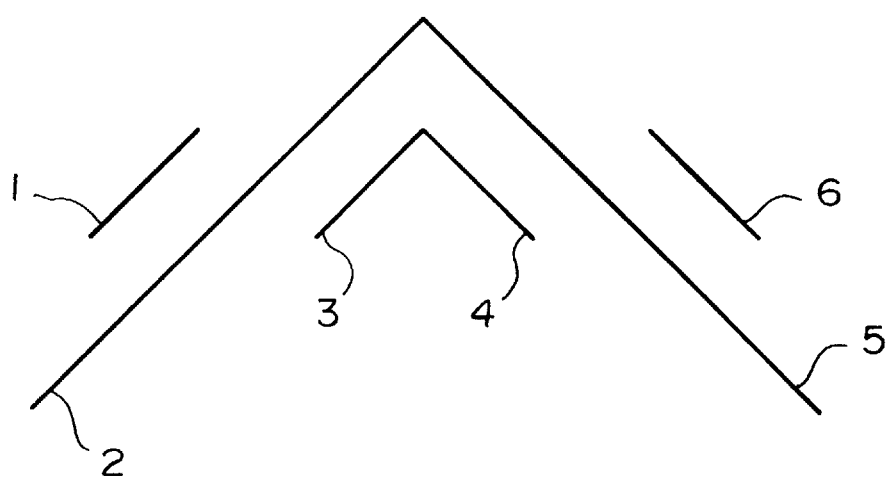
FIG. 2a illustrates the best contemplated marks of the system of FIG. 1.
Figure 2B:
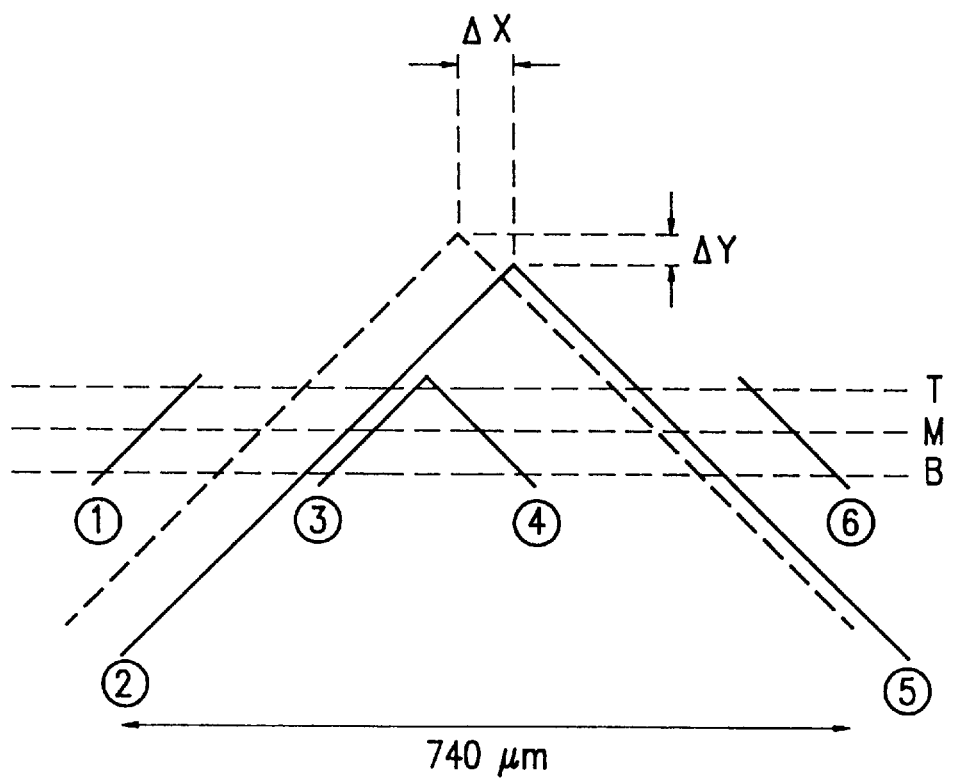
FIG. 2b shows marks of FIG. 2a when the wafer is slightly misaligned with respect to the hologram.

Referring to the drawings, alignment is achieved using a through-the-prism imaging system. Light from a filtered broad band source (not shown) is directed via a fiber-optic cable 10, a beam splitter 12 and a prism 14, and focussed onto a wafer 16 to illuminate alignment marks 1, 3, 4 and 6 on the wafer 16 and (modulated refractive index) alignment marks 2 and 5 in a holographic layer 18. The light reflected from the marks returns back through the prism 14 and beam splitter 12, to be collected and then focussed onto a CCD array 20. A frame grabber 22 captures the information for processing. FIG. 2a show a typical image after alignment, while FIG. 2b shows the image before alignment.

The Method

In a preferred embodiment of this invention, the alignment method has the steps which comprise: 1) the alignment marks on both the hologram and the wafer are prepared; 2) a minimum pre-alignment is carried out; 3) the wafer and hologram surfaces at the alignment marks are illuminated by an illumination beam; 4) the beam is reflected from the marks and the image of the marks is read by a detector; 5) the image information is processed by a computer using a series of mathematical algorithms; 6) an error signal is generated; 7) the wafer or the hologram, or both, are translated and/or rotated an amount proportional to the error signal; 8) the steps 3–6 are repeated; 9) the lithographic process is initiated.

The present invention includes a method of position alignment of a hologram with respect to a substrate to be printed which comprises the steps:

(a) making alignment marks on the substrate to be printed, and making alignment marks on the hologram, either on the hologram substrate or in the hologram recording material layer;

(b) imaging the alignment marks through an optical path;

(c) comparing the position of the alignment marks on the hologram with the position of the alignment marks on the substrate to be printed;

(d) adjusting the position of either the substrate to be printed or the hologram in accordance with the comparison of step (c).

The present invention further includes a method of position alignment of a hologram with respect to a substrate to be printed in a lithography process which comprises the steps:

(a) making alignment marks on the substrate to be printed, and making alignment marks on the hologram, either on the hologram substrate or in the hologram recording material layer;

(b) prealigning the hologram with respect to the substrate to be printed;

(c) illuminating the alignment marks;

(d) detecting a reflected optical beam passed through an optical path, the path of which is necessarily to pass through a prism;

(e) processing image information from the detected beam using a computer;

(f) generating an error signal dependent upon the displacement of the marks with respect to each other;

(g) moving the wafer with respect to the hologram in accordance with the generated error signal;

(h) optionally repeating steps (c) and (d), and also (e) through (g), if the alignment is not sufficient; and (i) initiating the lithography process.

The first step, preparation of the alignment marks, is complicated by the fact that it is intended to align a hologram to a wafer. Alignment marks can be put onto the wafer easily because the wafer has recording medium that responds to exposure to light and can be chemically processed such that permanent marks in the recording medium are realized. Alignment marks in the hologram are significantly more difficult to produce. The holographic recording material responds to exposure to light, but cannot be chemically processed to make marks in the layer. The holographic recording layer changes its optical density when exposed to light. The material shrinks in volume in areas of exposure. The resultant localized modulated optical density of the holographic recording layer causes a scattering of the incident illumination light, in that region. When imaged using a low numeric aperture lens system this scattered light is not collected and the exposed region, or alignment mark, is seen as a dark shadow in a bright surround. The mark is seen with good contrast, but relatively poor edge sharpness. This method enables the transfer of the alignment marks off the original mask into the holographic recording layer at the same time as the transfer of the lithographic information is performed.

It is possible to improve the edge sharpness by putting permanent marks on the substrate of the hologram. The holographic material is transparent and marks that have been previously put on the substrate by etching or engraving can be seen through the holographic recording material. This method however necessitates an extra alignment step by having to align the permanent marks to those on the original mask prior to transferring the lithographic information into the holographic recording layer.

The second step, the pre-alignment step, is to place the alignment marks in a position that allows both to be illuminated, and both to be imaged by the detection system. For the processing algorithm, it is required that the first mark be pre-aligned such that it appears in the image to be somewhere between the second marks parallel lines on both sides, like FIG. 2b. This can be accomplished by a coarse placement of the wafer with respect to the hologram either by a machine that has automatic placement accuracy within the limits of the marks or by a human operator that can resolve the position accurately with the aid of a microscope. For our system, we use standard wafer handling equipment that has placement accuracy less than 0.1 millimeter which satisfies our requirement. The pre-alignment step ends with the initialization of the alignment mark illumination and imaging equipment.

The third step, the illumination step, is accomplished by means of a strong light source that is coupled to a fiber optic transmission cable. The light emanating from the cable is focused with a lens to a small spot but a spot that is large enough to completely illuminate the area of the alignment marks. The photoresist recording medium is not sensitive to the frequency of the alignment illumination light. The configuration requires that the lens is placed such that the end of the fiber optic is near the focal point of the lens. This arrangement is used because the optical path to the wafer and hologram planes is necessarily long due to the requirement that a prism be placed in contact with the hologram. The illumination spot must be transmitted through the prism before it is incident on the alignment marks. In order for a return beam to be viewed, a beamsplitter is also added to the optical train. A portion of the illumination beam is lost as is a portion of the reflected beam but it allows the physical position of the source and detector to be different while sharing the same optical path through the prism; a common optics technique.

The next step, the read step, is accomplished with an image detector called a charge coupled device (CCD), frame storage electronics and software to drive the electronics. An image of the alignment marks, which appear to be in the same plane due to the good depth of focus of an imaging lens, is focused onto the CCD detector. The image intensity as a function of a two dimension position is converted to an electrical signal compatible with microprocessors and put into the computer memory by the frame storage electronics.

The next step, the displacement calculation step, requires a microcomputer to analyze the data stored in the memory to determine the relationship of the marks with respect to each other and hence the position of the wafer with respect to the hologram. After the position is determined, the correct position (known) is compared to the current position. If they are the same, then the next step is skipped and the lithography process begins. If the two positions are different, the computer generates a signal that can be sent to a translation device.

The following step, the translation step, is accomplished by using the error signal that has been generated by the computer and causing a translation of the wafer or the hologram with a linear motor, stepper motor, PZT or other movement means. The movement is proportional in distance to the error signal generated. After movement has been made, the read step, step 4 is repeated. It assures that the movement made has put the mask and hologram in the desired position. If the new position is not correct, another error signal is generated, and another move step is performed. If the new position is correct, the method continues to the final step.

The final step is to initiate the lithography process. This is done by the computer generating a signal that lets either of two other systems begin. In the case of applications that require coarse accuracy alignment, the lithographic exposure process begins. In the case of a system that requires a higher accuracy alignment, the system generates a signal to initiate a fine alignment system. It may be possible to reverse the order of one or more of the steps and the numbering of the steps is for clarity but is not intended to imply a sequence of steps.

An alternate method is a method of aligning a total internal reflection (TIR) hologram with respect to a substrate to be printed from the TIR hologram, in which the TIR hologram has a complex high frequency modulation of refractive index formed by holographically recording a pattern into a holographic recording layer. The method includes the steps of providing alignment marks on the substrate to be printed and then providing alignment marks in the holographic recording layer by including alignment marks in a mask and illuminating the alignment marks in the mask so that the light transmitted by the alignment marks in the mask is non-holographically recorded in the holographic recording layer. Preferably, the alignment marks and the TIR hologram in the recording medium are substantially simultaneously formed by illuminating the alignment marks and the pattern with an object beam and illuminating the holographic recording layer with a reference beam while blocking the reference beam from those parts of the holographic recording layer to include the alignment marks.

Next, the alignment marks are illuminated in the holographic recording layer and on the substrate to be printed and the light reflected from the alignment marks is imaged through an optical system onto a detector. Collimated light is employed to illuminate the alignment marks in the holographic recording layer.

The next step includes comparing the positions of the alignment marks in the holographic recording layer with the positions of the alignment marks on the substrate to be printed and the relative position of either the substrate to be printed or the TIR hologram is adjusted in response to the comparison of the positions.

The method further comprises employing a photosensitive recording layer on the substrate to be printed, wherein the photosensitive layer is insensitive to illuminating the alignment marks in the holographic recording layer and on the substrate to be printed.

The method further comprises sizing the alignment marks in the mask and separating the mask and the holographic recording layer so that light transmitted by an alignment mark in the mask illuminates a region of the holographic recording layer of substantially the same size as the alignment mark in the mask.

A further method includes aligning a second-level pattern recorded in a TIR hologram with respect to a first-level pattern printed on a substrate, comprising providing a mask bearing the second-level pattern and alignment marks; non-holographically recording the alignment marks in the mask into the holographic recording layer by illuminating the alignment marks in the mask; recording a TIR hologram of the second-level pattern by illuminating the second-level pattern in the mask with an object beam and illuminating the holographic recording layer with a reference pattern; providing a substrate bearing reference alignment marks and the first-level pattern; illuminating the alignment marks in the holographic recording layer and the reference alignment marks on the substrate with an illumination beam, preferably a collimated light beam, and imaging the light reflected from the marks through an optical system onto a detector; comparing the positions of the alignment marks in the holographic recording layer with the positions of the reference alignment marks on the substrate; and adjusting the relative position of either the substrate or the TIR hologram in response to the comparison of positions.

Preferably, in employing this method, the non-holographic recording of the alignment marks and the recording of the TIR hologram are carried out simultaneously by illuminating the second-level pattern and the alignment marks in the mask with the object beam and illuminating the holographic recording layer with the reference beam while blocking the reference beam from those parts of the holographic recording layer to record the alignment marks. Further, a photosensitive layer is employed on the substrate wherein the photosensitive layer is insensitive to the illumination beam. Preferably, the alignment marks in the mask are sized and the mask and the holographic recording layer are separated so that the object beam light transmitted by an alignment mark in the mask illuminates a region of the holographic recording layer of substantially the same size as the alignment mark in the mask.

The prior art references disclose or suggest the holographic recording of alignment marks in the recording layer, wherein the holographic alignment marks must be reconstructed rather than merely illuminated to permit use of the marks. The present invention employs the nonholographic recording in a holographic recording layer of alignment marks in a mask. Therefore, in the subsequent alignment process, the alignment marks in the holographic recording layer are not reconstructed to form images of the alignment marks on the surface of the substrate to be printed, but are rather imaged (by nonholographical illumination) so that the light reflected from the alignment marks is imaged by an optical system onto a detector.

A substantial disadvantage of the alignment marks and alignment methods of the prior art is that the alignment marks have to be reconstructed with a light at the same wavelength to which the recording layer is sensitive. Because the alignment marks in the holographic layer are preferably located in proximity to the TIR hologram of the pattern, it is extremely difficult and often impossible, to reconstruct the alignment marks without also reconstructing the pattern features. This precludes alignment, as the reconstruction of the pattern must occur after alignment.

The Apparatus

In a preferred embodiment the apparatus has eight major parts: 1) a fiber optic cable with suitable collimating optics to couple the light from a light source through; 2) a beam splitter to divide and change the direction of the beam; 3) a wafer that is to be printed on and has been initialized with alignment marks; 4) a hologram also with alignment marks installed; 5) a chuck that is moveable linearly and/or rotationally; 6) a charge coupled device image detector; 7) an image processing electronics device; and 8) a computer.

Preferably, the present invention includes an apparatus for position alignment of a hologram with respect to a substrate to be printed, the hologram and the substrate both having alignment marks thereon, which apparatus comprises: (a) an optical path imaging system for imaging the alignment marks on the hologram and the substrate; and (b) means for moving the substrate with respect to the hologram in accordance with a comparison of the positions of the imaged alignment marks.

The fiber optic cable is used to deliver light generated at a source into the apparatus. The light emitted from the end of the fiber appears to be coming from a virtual point and the point can then be imaged onto the alignment marks. This configuration is good for bright uniform illumination of the alignment marks which is necessary for a good contrast signal at the detector. The fiber optic is also necessary as the apparatus could not tolerate the bulk and the heat generated by a light source that is near the system.

The path of the returning light coexists with the path of the illumination beam. These paths can be separated by a beam splitter. The illumination beam from the fiber and a lens is incident on the beam splitter. A portion of the light passes through the device and is lost while the other half is reflected from the beam splitter and passes through the prism to the alignment marks. Similarly, the reflected beam from the alignment marks that is incident on the beam splitter, is partially reflected away and lost while the other portion is incident on the image detector. The mechanism allows a single optical path through the prism and hologram optics, that originates and terminates at two separate positions in space.

The wafer, or substrate, that is to be printed on, e.g. of silicon, has been coated with a light sensitive material called photoresist. Before the wafer has been coated and put into the system, it has been previously printed with a pattern and alignment marks. The alignment marks in the previously printed pattern are visible through the layer of photoresist.

A hologram comprises a rigid substrate of quartz or other optically transparent material, and a thin layer of holographic recording medium that has been processed to effect a holographic recording of some image. The hologram is put into optical contact with a prism which may or may not be an essential part of the holographic apparatus but not part of the alignment apparatus. Optical contact means that light passes easily without strong reflections from the prism to the hologram substrate through an index matching fluid. The mechanism that holds the substrate to the prism is not important to the apparatus, but the optical contact is. In some systems the surface tension of the fluid is sufficient to keep the substrate in physical contact with the prism.

A chuck to hold the wafer in proximity to the hologram may also be included in the apparatus. The chuck is moveable with respect to the hologram to effect position adjustments. The position adjustments can be of several types. Parallelism movements with respect to the hologram and distance movements away from the hologram do not nave direct implications on the alignment system, but are requirements of a good holographic lithography system. The chuck, capable of those movements, must also be capable of lateral movement with respect to the plane of the hologram, and rotational movement with respect to the center of the wafer. The chuck includes a transducer that is responsive to the signals generated by the computer. The movement can be accomplished in several ways. The chuck could use such mechanical systems as stepper motors. For the movements of the type required for submicron alignment, stepper motors are clumsy because of the effects of mechanical backlash. A preferred device is a piezoelectric (PZT) crystal. A PZT responds to an applied voltage and changes its length an amount that is proportional to the applied voltage. The accuracy is compatible with movements much less than a micron.

A CCD camera is a two dimension image detector that measures the intensity of an image as a function of position. The image of the marks is incident on the image plane of the device by way of a lens or lenses in the reflected beam path. The optical information is converted at image plane into electrical signals.

The "frame grabber" electronics is an electrical instrument that processes the electrical signal from the CCD camera into a computer readable form. These electronics are assembled as a package and are commonly available under the names "frame grabber" or "frame storage" instruments. The electronics package is built to a specific computer configuration and sometimes comes complete with software to run the device.

The computer is required to do the mathematical processing of the data. This includes the algorithm required to measure the distances between the lines. The lateral displacements in the two orthogonal directions x, y are computed by the equation:

$$\delta X = 0.25(+(A-B)+(C-D)) \quad (1)$$

and $$\delta Y = 0.25(-(A-B)+(C-D)) \quad (2)$$

where A,B,C, and D are the horizontal distance between the diagonal lines labeled 1 and 2, 2 and 3, 4 and 5, and, 5 and 6, in FIG. 2b. Using two sets of marks separated by a distance L, translation misalignments delta X and delta Y were computed as the average of the two sets and rotational misalignment computed from the equation:

$$\delta(\Theta) = \arctan((\delta X_1 - \delta X_2)/L) \quad (3)$$

For Equation 3 to be true, the two sets of marks must be positioned on the hologram and wafer with the same distance between each mark and the center of the wafer. The error signal is generated in proportion to the misalignment that is computed by the equations above. The computer then electrically drives the chuck.

While the above description contains many specifics, these specifics should not be construed as limitations on the scope of the invention, but merely as an exemplification of a preferred embodiment thereof. Those skilled in the art will envision other possible variations that are within the scope and spirit of the invention as defined by the claims appended hereto.

What is claimed is:

1. A method of aligning a TIR hologram with respect to a substrate to be printed from the TIR hologram, the TIR hologram having a complex high frequency modulation of refractive index formed by holographically recording a pattern into a holographic recording layer, the method comprising the steps:
   (a) providing alignment marks on the substrate to be printed;
   (b) providing alignment marks in the holographic recording layer by including alignment marks in a mask and illuminating the alignment marks in the mask so that the light transmitted by the alignment marks in the mask is non-holographically recorded in the holographic recording layer;
   (c) illuminating the alignment marks in the holographic recording layer and on the substrate to be printed and imaging the light reflected from the alignment marks to form corresponding images that are passed through an optical system onto a detector;
   (d) comparing the positions of the corresponding images; and
   (e) adjusting the relative position of one of the substrate to be printed or the TIR hologram in response to the comparison of positions.

2. The method of claim 1, further comprising substantially simultaneously forming the alignment marks and the TIR hologram in the recording medium by illuminating the alignment marks and the pattern with an object beam and illuminating the holographic recording layer with a reference beam while blocking the reference beam from those parts of the holographic recording layer to include the alignment marks.

3. The method of claim 1, further comprising employing a photosensitive recording layer on the substrate to be printed, wherein the photosensitive layer is insensitive to illuminating the alignment marks in the holographic recording layer and on the substrate to be printed.

4. The method of claim 1, further comprising sizing the alignment marks in the mask and separating the mask and the holographic recording layer so that light transmitted by an alignment mark in the mask illuminates a region of the holographic recording layer of substantially the same size as the alignment mark in the mask.

5. The method of claim 1, further comprising employing collimated light to illuminate the alignment marks in the holographic recording layer.

6. A method of aligning a second-level pattern recorded in a total internal reflection hologram with respect to a first-level pattern printed on a substrate, comprising:
   (a) providing a mask bearing the second-level pattern and alignment marks;
   (b) non-holographically recording the alignment marks in the mask into the holographic recording layer by illuminating the alignment marks in the mask;
   (c) recording a TIR hologram of the second-level pattern by illuminating the second-level pattern in the mask with an object beam and illuminating the holographic recording layer with a reference pattern;
   (d) providing a substrate bearing reference alignment marks and the first-level pattern;
   (e) illuminating the alignment marks in the holographic recording layer and the reference alignment marks on the substrate with an illumination beam and imaging the light reflected from the marks to form corresponding images that are passed through an optical system onto a detector;
   (f) comparing the positions of the corresponding images; and
   (g) adjusting the relative position of either the substrate or the TIR hologram in response to the comparison of positions.

7. The method of claim 6, wherein the non-holographic recording of the alignment marks and the recording of the TIR hologram are carried out simultaneously by illuminating the second-level pattern and the alignment marks in the mask with the object beam and illuminating the holographic recording layer with the reference beam while blocking the reference beam from those parts of the holographic recording layer to record the alignment marks.

8. The method of claim 6, further comprising employing a photosensitive layer on the substrate wherein the photosensitive layer is insensitive to the illumination beam.

9. The method of claim 6, further comprising sizing the alignment marks in the mask and separating the mask and the holographic recording layer so that the object beam light transmitted by an alignment mark in the mask illuminates a region of holographic recording layer of substantially the same size as the alignment mark in the mask.

10. The method of claim 6, further comprising using a collimated light in the illumination beam.

* * * * *